United States Patent [19]

Beltram et al.

[11] Patent Number: 4,945,393
[45] Date of Patent: Jul. 31, 1990

[54] FLOATING GATE MEMORY CIRCUIT AND APPARATUS

[75] Inventors: Fabio Beltram, Jersey City; Federico Capasso, Westfield; Roger J. Malik, Summit; Nitin J. Shah, Scotch Plains, all of N.J.

[73] Assignee: AT&T Bell Laboratories, Murray Hill, N.J.

[21] Appl. No.: 447,286

[22] Filed: Dec. 7, 1989

Related U.S. Application Data

[62] Division of Ser. No. 209,466, Jun. 21, 1988, Pat. No. 4,905,063.

[51] Int. Cl.$^5$ .......................................... H01L 29/78
[52] U.S. Cl. ..................................... 357/23.5; 357/16; 357/45; 357/30; 365/185; 365/187; 307/305; 307/296.1
[58] Field of Search ..................... 357/16, 22 A, 23.5, 357/30 E, 45; 365/185, 187; 307/305, 238

[56] References Cited

U.S. PATENT DOCUMENTS

| | | | |
|---|---|---|---|
| 3,500,142 | 3/1970 | Kahng | 317/235 |
| 3,593,037 | 7/1971 | Hoff, Jr. | 365/187 |
| 4,763,177 | 8/1988 | Paterson | 357/23.5 |
| 4,766,473 | 8/1988 | Kuo | 357/23.5 |
| 4,803,529 | 2/1989 | Masuoka | 355/185 |
| 4,806,998 | 2/1989 | Vinter et al. | 357/16 |
| 4,821,093 | 4/1989 | Iafrate et al. | 357/16 |

OTHER PUBLICATIONS

Judaprawira et al., "Modulation-doped MBE GaAs/-n-Al$_x$Ga$_{1-x}$As MESFETS," *IEEE Electron Device Letters*, vol. EDL-2, No. 1, Jan, 1981, pp. 14–15.
"Hot Electron Injection Devices", S. Luryi et al., *Superlattices and Microstructures*, vol. 1, No. 5, 1985, pp. 389–400.
"Effect Of A Buried Superlattice on the Dynamic Storage of Electrons at the AlGaAs/GaAs Heterojunction", Appl. Phys. Lett. vol. 50, No. 8, Jun. 1987, pp. 1657–1659.
"Fast Switching and Storage in GaAs-Al$_x$GA$_{1-x}$ As Heterojunction Layers", M. Keever et al., *IEEE Electron Device Letters*, vol. EDL-3, No. 10, Oct. 1982.
"Long Term Storage of Inversion Holes at a Superlattice/GaAs Interface", M. R. Melloch et al., Appl. Phys. Lett, vol. 49 (21), 24 Nov. 1986, pp. 1471–1472.
Modern MOS Technology: Processes, Devices and Design, D. G. Ong, pp. 215–217.
Physics of Semiconductor Devices, Second Edition, S. M. Sze 1981, pp. 496–505.
"A Thermal-Generation-Limited Buried-Well Structure for Room-Temperature GaAs Dynamic RAM's", T. E. Dungan et al., *IEEE Electron device Letters*, vol. EDL-8, No. 5, May, 1987 pp. 243–245.
"Hot-electron Memory Effect in Double-Layered Heterostructures", *Appl. Phys. Letters* 45 (12), 15 Dec. 1984, pp. 1294–1296, S. Luryi.

*Primary Examiner*—Andrew J. James
*Assistant Examiner*—Courtney A. Bowers
*Attorney, Agent, or Firm*—Michael J. Urbano

[57] ABSTRACT

A floating gate memory device comprises a channel for conducting carriers from source to drain, a semiconductor heterostructure forming a potential well (floating gate) for confining carriers sufficiently proximate the channel so as to at least partially deplete it, and a graded bandgap injector region between the control gate and the floating gate for controlling the injection of carriers into and out of the potential well. Also described is a three element memory cell, including the memory device and two FETs, which operates from a constant, non-switched supply voltage and two-level control voltages. Arrays of memory devices may also be used to detect light in a variety of applications such as imaging.

3 Claims, 5 Drawing Sheets

FLOATING GATE MEMORY CIRCUIT AND APPARATUS

This is a division of application Ser. No. 209,466 filed June 21, 1988, U.S. Pat. No. 4,905,063.

BACKGROUND OF THE INVENTION

This invention relates to microelectronic memories and, more particularly, to floating gate memory devices.

In recent years considerable effort has been devoted to the development of GaAs-based static random access memories (SRAMS). There has been, on the other hand, very limited activity on dynamic random access memories (DRAMS), although AlGaAs/GaAs structures for such applications have been proposed. See, for example, T. E. Dungan et al, *IEEE Electron Dev. Lett.*, Vol. EDL-8, p. 243 (1987), M. R. Melloch et al, *Appl. Phys. Lett.*, Vol. 49, p. 1471 (1986), and M. R. Melloch et al, *Appl. Phys. Lett.*, Vol. 50, p. 1657 (1987). Likewise there has been little, if any, work on GaAs-based read only memories (ROMs) whether electronically programmable (EPROMs) or not.

Previously, however, workers in the art have demonstrated the storage of carriers in heterostructures following hot electron injection by real-space transfer (M. Keever et al, *IEEE Electron Dev. Lett.*, Vol. 3, p. 297–299 (1982)). Luryi et al observed a long-term memory effect in a charge injection transistor at 77° K. when the collector electrode was disconnected (S. Luryi et al, *Appl. Phys. Lett.*, Vol. 45, p. 1294–1296 (1984)). This effect is due to charge accumulation in the floating substrate due to hot electron injection. Hot electron programmable random access memories based on the effect were subsequently proposed (S. Luryi et al, *Superlattices and Microstructures*, Vol. 1, p. 389–400 (1985)).

An important class of Si-based non-volatile memories utilize floating gate devices which are described by S. M. Sze, *Physics of Semiconductor Devices*, Wiley, New York (1981), p. 496. These devices are currently being commercially used in a large variety of applications ranging from computers to microprocessor-controlled equipment. In conventional Si-based floating gate memory devices, electrons are injected from the channel into a polysilicon floating gate surrounded by insulators. Injection occurs via either an avalanche or a tunneling mechanism after application of a large positive voltage (several tens of volts) to the control gate. The stored charge in the floating gate then modifies the channel conductance. To erase the memory a large negative voltage is applied to the control gate so that the charge is injected from the floating gate back into the channel by tunneling.

The standard Si-based floating gate memory circuit utilizes the same electrical path to perform the read and write functions and a single FET to control current flow in that path. Three voltage levels, including a switched power supply, are used to perform read, write and erase functions (Ong, D. G., *Modern MOS Technology: Processes, Devices & Design*, McGraw Hill, 1984, pp. 215–217.

SUMMARY OF THE INVENTION

In accordance with one aspect of the invention, a floating gate memory device comprises control gate, source and drain electrode means, a semiconductor channel for conducting carriers from the source to the drain, a semiconductor heterostructure forming a potential well (floating gate) for confining carriers sufficiently proximate the channel so as to at least partially deplete it, and a graded bandgap region between the control gate and the floating gate for controlling the injection of carriers into and out of the potential well; i.e., during write and erase operations, respectively. Because electrons are injected from the control gate into the floating gate via thermionic or space-charge limited injection, in Group III-V compound devices (e.g., GaAs/AlGaAs) the typical write voltages (a few volts) are considerably smaller than those required for conventional Si-based floating gate devices (several tens of volts). The lower voltage results in faster operation and compatibility with standard GaAs IC power supply voltages (1–1.5 V).

Another aspect of the invention resides in a memory circuit made possible by the inventive memory device in which the read, write and erase functions require only two voltage levels on the row and column select (write) lines, with the power supply being a constant voltage rather than a switched one. Each memory cell includes a first FET having its channel connected between the control gate of the memory device and a write line and a second FET having its channel connected between the drain of the memory device and a read line, with the gates of the two FETs connected to the same (e.g., row) select line.

In addition, unlike some Si-based floating gate memories, the entire memory does not have to be erased before a particular cell can be written because a logic "0" can be written into that cell without changing the state of any other cell, if so desired.

BRIEF DESCRIPTION OF THE DRAWING

The invention, together with its various features and advantages, can be readily understood from the following, more detailed description taken in conjunction with the accompanying drawing, in which the various figures are not drawn to scale in the interests of clarity.

FIG. 1 is a schematic cross-sectional view of a self-aligned floating gate memory device in accordance with one embodiment of the invention including, at the right, an equilibrium conduction band energy diagram of the structure;

FIGS. 2–5 show the conduction band energy diagrams of the device of FIG. 1 in logic state "0" with no carriers in the potential well or floating gate (FIG. 2), during a write operation (FIG. 3), in logic state "1" with carriers in the well (FIG. 4), and during an erase operation (FIG. 5);

FIG. 6 shows a conduction band energy diagram of a memory device in accordance with another embodiment of the invention in which the injector is graded on both sides and/or the channel-side barrier is of increased height;

FIG. 7 shows a conduction band energy diagram of yet another embodiment of our invention in which the well is deeper adjacent the channel barrier;

FIGS. 8–10 show conduction band energy diagrams of an embodiment of the invention in equilibrium (FIG.

Figure 14:
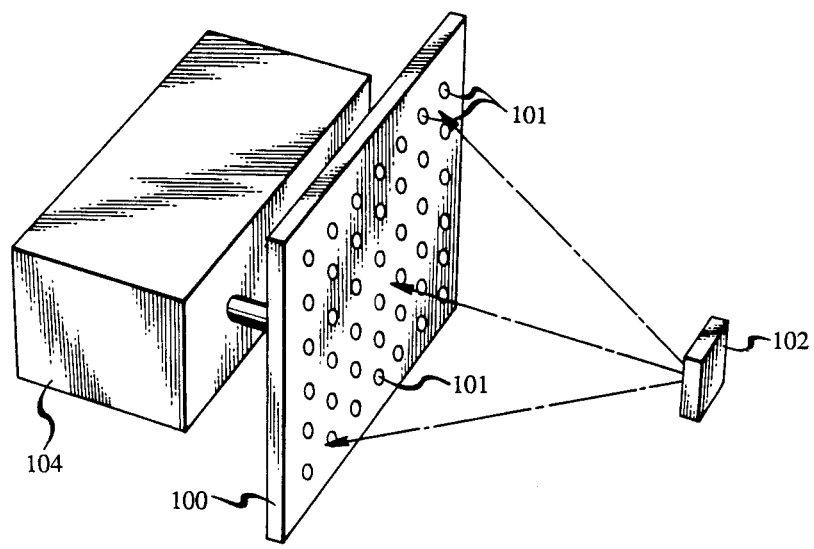
Figure 6:
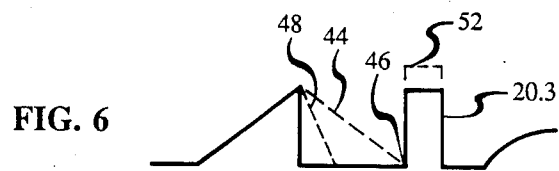
Figure 9:
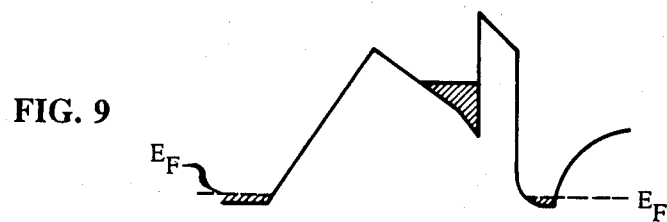
Figure 10:
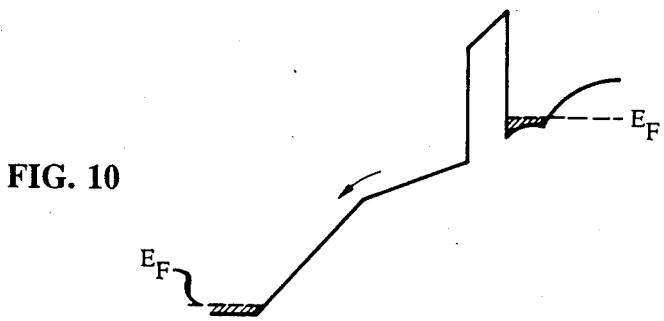
Figure 11:
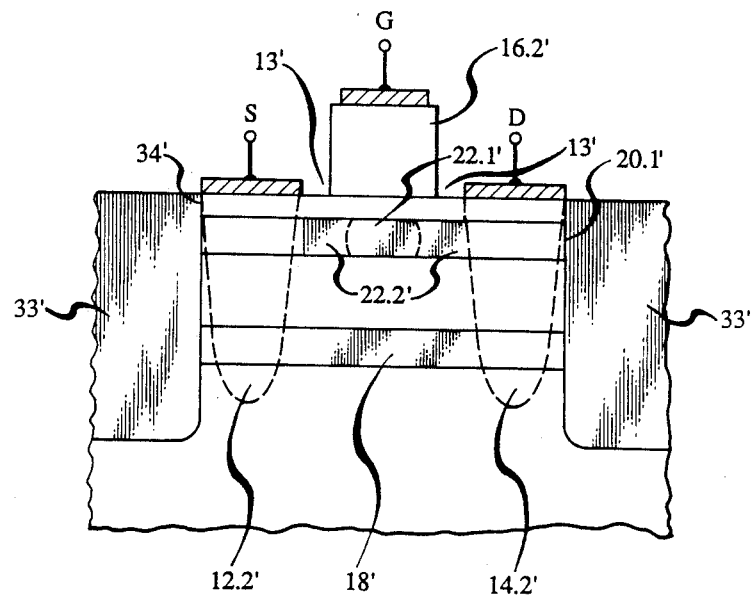
Figure 12:
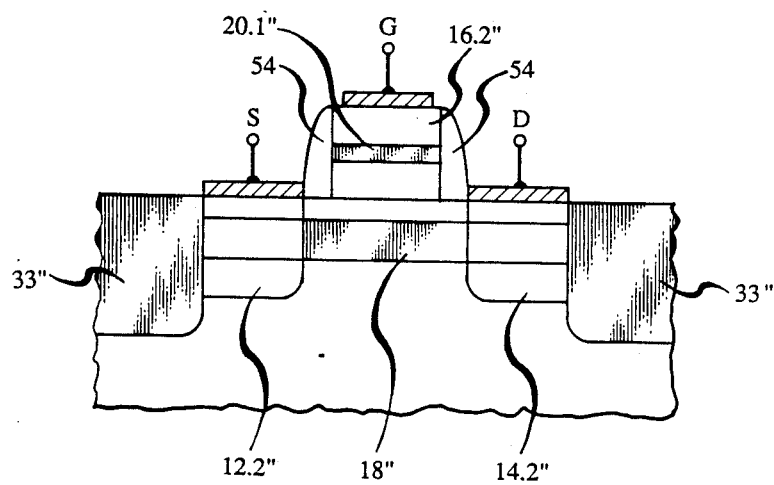
Figure 13:
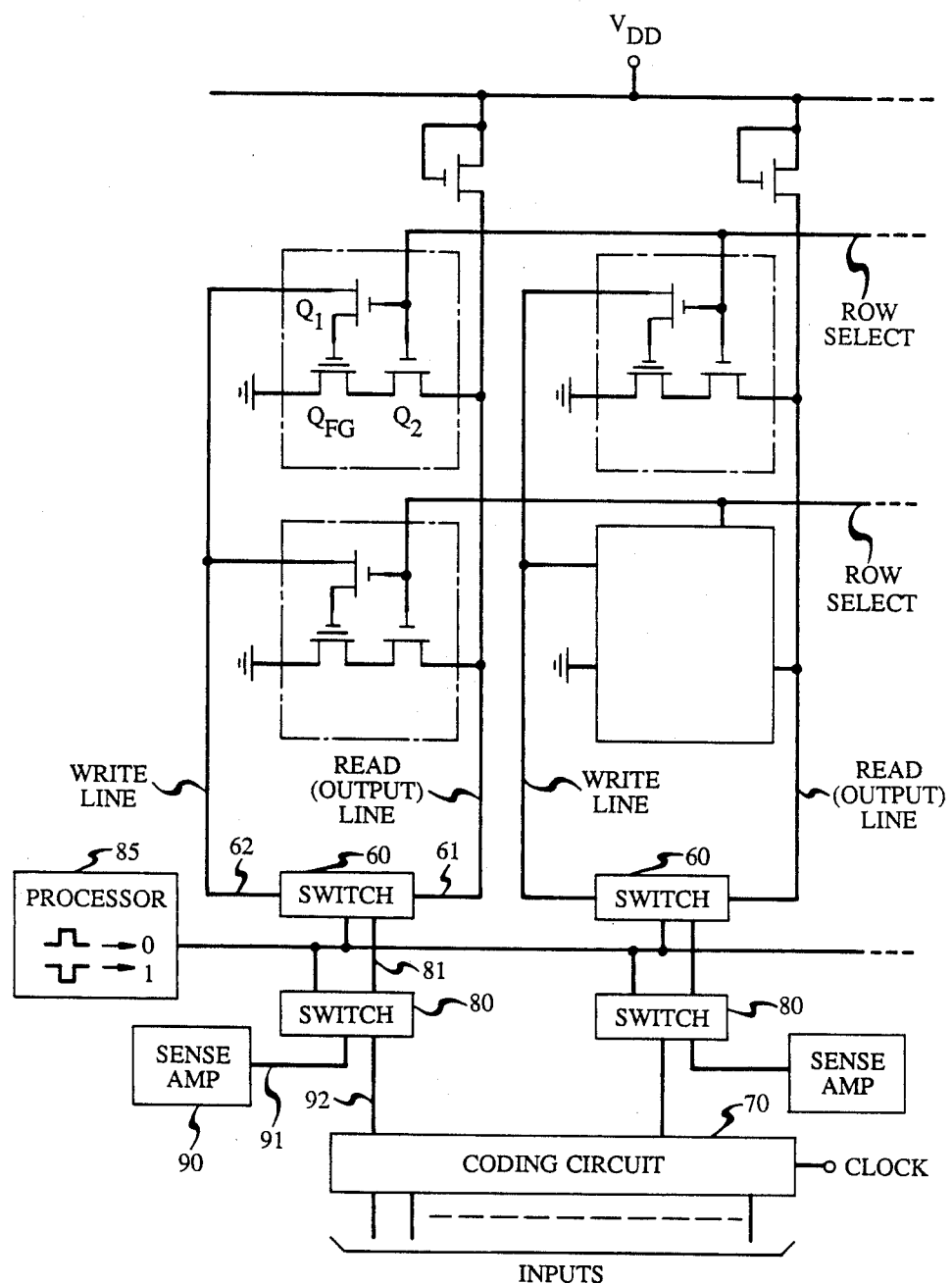

8) corresponding to FIG. 6 with the channel-side grading of the injector being depicted by line 44, in logic state "1" with carriers in the potential well (FIG. 9), and during an erase operation (FIG. 10);

FIG. 11 is a schematic cross-sectional view of an illustrative embodiment in which the mesa is etched by reactive ion etching (RIE);

FIG. 12 is a schematic cross-sectional view of still another embodiment in which the floating gate is located in the mesa, the sidewalls of which are passivated;

FIG. 13 is a memory circuit in accordance with another aspect of the invention; and FIG. 14 is a schematic of an imaging application of an array of memory devices in accordance with still another aspect of the invention.

DETAILED DESCRIPTION

Figure 1:
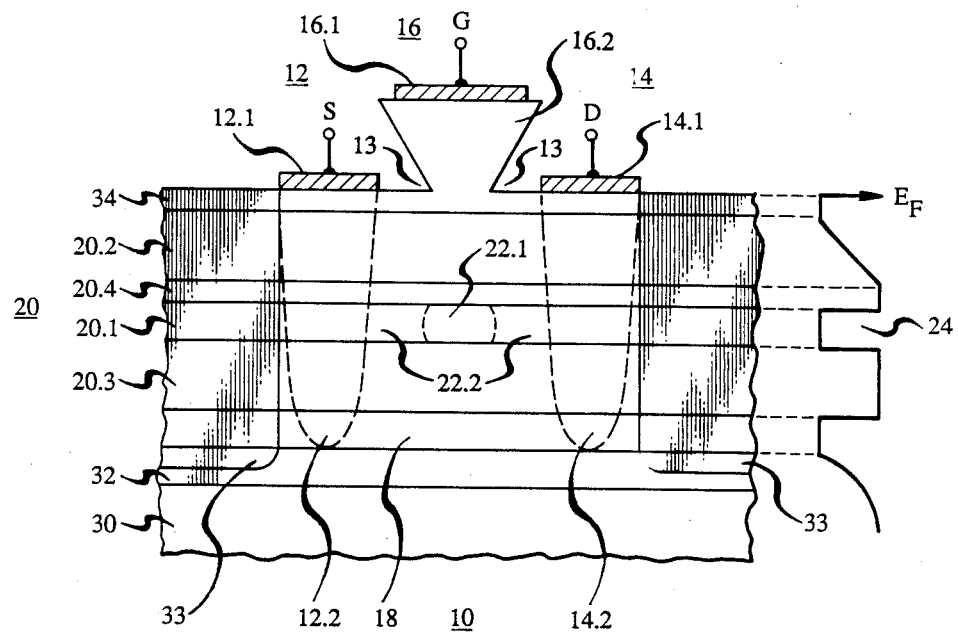
In FIGS. 1, 11 and 12, corresponding components have been given identical reference numerals, but with primed notation in FIG. 11 and double-primed notation in FIG. 12.

Turning now to FIG. 1 there is shown a floating gate memory device 10 in accordance with one embodiment of the invention comprising source electrode means 12, drain electrode means 14, control gate electrode means 16 and a semiconductor channel 18 for conducting carriers from the source to the drain. In this context, the electrode means is understood to include not only the metal layers (contacts) 12.1, 14.1 and 16.1, but also zones 12.2 and 14.2 utilized to provide low resistance path between the channel 18 and the source and drain contacts. These zones may be formed, for example, by ion-implantation or by alloying the contacts, as is well known in the art. Likewise, the electrode means includes contact-facilitating layer 34 and mesa 16.2 which may be formed therefrom.

A semiconductor heterostructure 20 is disposed between the channel 18 and the control gate means 16. The heterostructure includes a narrow bandgap region 20.1 forming a potential well 24 (or floating gate) which is located sufficiently proximate the channel 18 to at least partially deplete it when carriers are present in the well. The heterostructure also includes a graded bandgap injector region 20.2 for controlling the injection of carriers from the control gate 16 into the potential well 24 and conversely. To confine (store) carriers in the potential well, region 20.1 is typically bounded by a wider bandgap channel-side barrier layer 20.3 and an optional, wider bandgap gate-side barrier layer 20.4. The latter is optional because the wide bandgap portion of the injector region may serve as the gate-side barrier. The thickness of the channel-side barrier is chosen to be large enough to prevent carriers from tunneling from the well into the channel 18, yet, at the same time, thin enough to allow carriers in the well to at least partially deplete the channel. To provide better confinement of carriers in the channel 18 an additional barrier layer or superlattice (not shown) may be disposed between the channel and the buffer layer 32.

In a practical embodiment, the device also includes a semi-insulating substrate 30 on which the buffer layer 32 may be epitaxially grown. In addition, the configuration depicted in FIG. 1 relies upon an inverted trapezoidal mesa 16.2 on which the gate contact 16.1 is formed and which further utilizes the undercut of the mesa to effect self-aligned deposition of the source and drain contacts 12.1 and 14.1, as is well known in the art.

Figure 2:
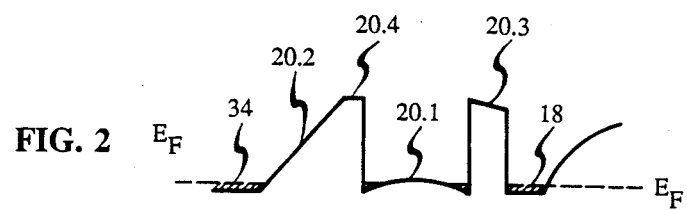
In FIGS. 2–10 the energy band diagrams are schematic and do not account for subtleties resulting from the direct-indirect band structure transitions.
Figure 3:
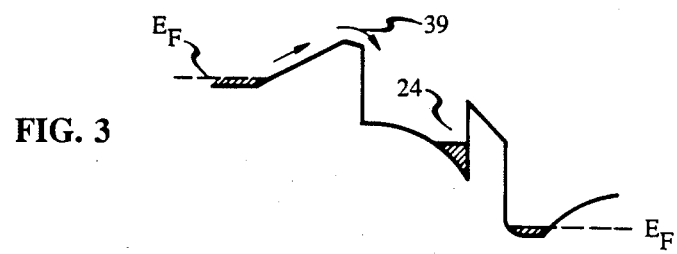
Figure 4:
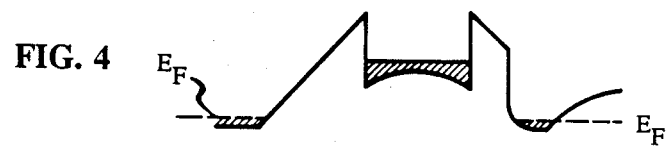
Figure 5:
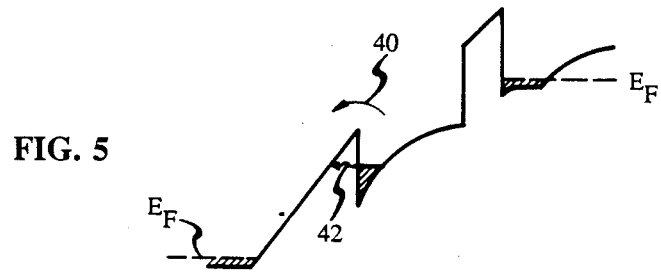

In operation, which will be described in conjunction with FIGS. 2-5, the memory device is in a logic "0" state, as shown in FIG. 2, when there are no carriers in the potential well 24. Under these conditions the channel is not depleted and the magnitude of current flowing from the source to the drain can be detected during a read operation as corresponding to logic "0". To perform a write operation a negative voltage is applied to the gate in order to depress the graded bandgap region 20.2 and the gate barrier 20.4, as shown in FIG. 3, thereby enabling carriers to be injected via thermionic injection (arrow 39) into the well 24. When the write voltage is removed, the band diagram is depicted in FIG. 4 with carriers in the well 24 causing at least partial depletion of the channel 18; that is, the carriers in the well repel the carriers in the channel causing the latter to move away from the interface between the channel-side barrier and the channel itself. This depletion of the channel adjacent to the interface means that the effective channel width where carriers flow is smaller and its resistance is higher. The magnitude of current which flows from the source to the drain is thereby reduced and can be detected as corresponding to logic state "1". The carriers are stored in the well for an extended period of time and thus the memory device need not be refreshed. To erase the memory a positive voltage is applied to the gate and, as shown in FIG. 5, carriers in the well 24 are injected back into the control gate principally via tunneling (arrow 42) although some thermionic emission may occur.

Figure 8:
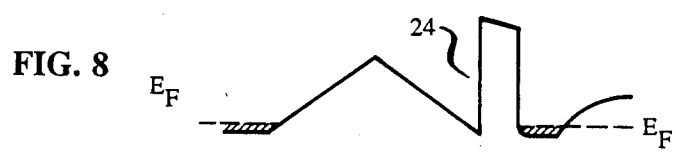

Since the removal of carriers from the potential well by tunneling is an inefficient mechanism, in that it involves use of relatively high electric fields, it is preferred that the structure be designed to enhance thermionic emission. To do so the graded bandgap injector region 20.2 is preferably graded on both sides, as shown in FIG. 6. In one embodiment depicted by dashed line 48 of FIG. 6, the grading on the channel side of the injector region extends only part way to the channel-side barrier 20.3. Preferably, however, the grading of the injector region, as depicted by dashed line 44, extends all the way to the channel-side barrier 20.3. The latter embodiment has the virtue of symmetrical (or nearly so) write and erase operations. FIGS. 8-10 depict this embodiment in three stages: no charge in the well 24 (FIG. 8), charge in the well (FIG. 9), and during an erase operation (FIG. 10) which points out how the double-sided grading of the barrier facilitates efficient erasure.

Figure 7:
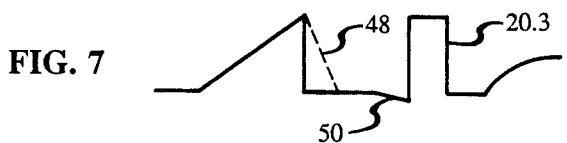

Alternatively, carriers may be confined adjacent the channel-side barrier 20.3 by forming there a deeper potential well 50, as shown in FIG. 7. Well 50 may be realized by growing a narrower bandgap (e.g., compositionally graded) layer adjacent to barrier 20.3.

The barrier layers are preferably made of indirect bandgap semiconductor material, whereas the potential well 24 (i.e., region 20.1) is preferably made of direct bandgap semiconductor material. In general, the object of these choices is to create an energy band structure mismatch; that is, to position the energy minima of the conduction bands of the well and barrier materials at different points in momentum space (known as symmetry points). This feature increases the time it takes for a carrier in the potential well to traverse a barrier via thermionic emission; hence it increases the storage time of the memory device. Storage time can also be increased by making the height of the barriers greater, as depicted, for example, by the dashed line 52 in FIG. 6.

In general, the various embodiments of the invention can be realized with semiconductor layers fabricated from Group III-V compound semiconductors which are essentially lattice-matched to one another, for example, GaAs/AlGaAs. Using this materials system, for example, the device of FIG. 1 could comprise GaAs for channel 18, potential well 24 (region 20.1), contact-facilitating layer 34, buffer layer 32 and substrate 30. Alternatively, the gate electrode means 16 may comprise a strained layer of highly doped InGaAs under a refractory metal layer 16.1 (e.g., W or WSi). The barrier layers 20.3 and 20.4 could comprise AlAs and the injector region 20.2 would be graded from a composition of GaAs adjacent layer 34 to AlAs adjacent layer 20.4. However, other semiconductor materials, including strained layers, are not precluded. For example, it may be desirable to exploit the high mobility of InGaAs by utilizing it as the material for channel 18. In addition, the embodiment of FIG. 7 utilizing a narrow bandgap material to form the deeper potential well 50 contemplates utilizing a narrower bandgap material which, if used in conjunction with the GaAs system, also implies a strained layer. Finally, materials other than Group III–V compounds may be utilized to fabricate all or part of the layers of the device. For example, the channel-side barrier layer 20.3 could comprise calcium fluoride (bandgap 12 eV) which can be epitaxially grown on GaAs (and conversely), thus enabling higher barrier energies compared to the lower ones available from AlGaAs. As noted before, in conjunction with FIG. 6, a higher barrier 52 enhances storage time.

From a processing standpoint, the embodiment of FIG. 1 may employ relatively standard wet chemical etching to produce the undercut mesa 16.2 as well as ion implantation of, for example, oxygen, boron or protons to create electrical isolation regions 33. Alternatively, as shown in FIG. 11, a relatively straight-walled mesa 16.2' can be realized using reactive ion etching and a suitable stop-etch layer (not shown) at the bottom of the mesa, such as a semiconductor layer containing Al. In both FIGS. 1 and 11 the carriers in the potential well 24 are laterally confined to a zone 22.1 or 22.1' underneath the gate due to Fermi-energy pinning (band bending) at the surface regions 13 or 13' which causes depletion from the surface through the floating gate layer 20.1 or 20.1', but only in zones 22.2 or 22.2' outside the overlaying gate. Some additional confinement is due to the screening of the source-drain field under the control gate by the high density of stored carriers there. Consequently, the positions of the potential well layer 20.1 and the channel 18 below the surface should be chosen so as to enhance the desired depletion of the former, but minimize that of the latter (outside the overlying gate). This goal can be facilitated also by suitable doping and thickness of contact-facilitating layer 34 or 34' in region 13 or 13'.

On the other hand, FIG. 12 differs from FIG. 11 in several respects. First, the floating gate layer 20.1" is located in the mesa 16.2", and the mesa has its vertical sidewalls passivated by dielectric layers 54 (e.g., $SiO_2$ or $SiN_x$) to reduce surface leakage. Second, the lateral extent of the zone in which carriers are confined in the floating gate layer is physically defined by the edges of the mesa 16.2", as compared to being defined by the depletion and screening effects mentioned above. In addition, FIG. 12 demonstrates self-aligned ion implanted contact regions 12.2" and 14.2".

The floating gate memory devices described above are incorporated into a unique memory circuit, as shown in FIG. 13, which is capable of operating from a constant (non-switched) supply voltage source $V_{DD}$ and with only two voltage levels required to perform write, read, erase and row select functions. Typically, a two level d.c. voltage signal is coupled to the row select lines, but opposite polarity pulses are applied to the write lines. See also claim 11. The floating gate memory device $Q_{FG}$ is incorporated in a memory cell which also includes a pair of field effect transistors (FETs) Q1 and Q2. Q1 has its channel connected between the control gate of $Q_{FG}$ and a write line. Q2 has its channel connected between the drain of $Q_{FG}$ and both a write line and the supply voltage. The source of $Q_{FG}$ is connected to a reference potential (e.g., ground), and the gates of Q1 and Q2 are connected together and to a row select line. The write line and read (or output) lines of each column are connected to a select switch 60 (or multiplexer) which is controlled (together with all the other such switches of other columns) by a computer processor 85 to set the memory to a read or write operation mode. Processor 85 supplies the opposite polarity pulses shown to control the states of switches 60 and 80.

In order to write a logic "1" into the memory device $Q_{FG}$ the row select voltage is made positive if Q1 and Q2 are enhancement mode n-channel FETs, which closes Q1 and Q2, and a negative pulse is applied to the write line through Q1 in order to charge the floating gate of $Q_{FG}$. (Opposite polarity select voltages would be employed if Q1 and Q2 are depletion mode n-channel FETs.) All other rows are at select line voltages which are negative, therefore the Q1's of those rows are open and the corresponding $Q_{FG}$'s are not charged. Conversely, in order to write a logic "0" (which is equivalent to the erase function) the same procedure is followed, except that a positive pulse is applied to the write line.

In order to perform the read operation, the row select line is again made positive in order to close Q1 and Q2 associated with the $Q_{FG}$ to be read. Then, the output line will be at the supply voltage $V_{DD}$ if $Q_{FG}$ is open (logic state "1"); i.e., no current flows through Q2 and $Q_{FG}$ to ground. On the other hand, the output line is at ground if $Q_{FG}$ is closed (logic state "0"); i.e., $Q_{FG}$ and Q2 are short circuits to ground. Note, during the read operation, only the selected Q2 is closed, all others are open. Therefore, even if the $Q_{FG}$'s associated with the other Q2's are closed, no current flows to their outputs.

In order to write a word (byte) of information into the memory circuit, an off-chip coding circuit 70, which illustratively includes an array of inverters with enable inputs, is coupled to the select switches 60. Each bit of the byte of information to be stored is supplied on separate input line to coding circuit 70. If the memory utilizes negative clock pulses, which are also supplied to the circuit 70, the clock pulse will be transferred unaltered from a coding circuit output to a particular write line if the bit supplied to the corresponding input to the coding circuit is a logic "1". In contrast, the clock pulse will be inverted if the corresponding bit is logic "0". The converse operation occurs if the memory uses positive clock pulses instead of negative ones. An illustrative write path includes line 92 connecting circuit 70 and switch 80, line 81 connecting switch 80 and switch 60, and line 62 connecting switch 60 and Q1.

In order to perform a read operation, an output line 61 is coupled through switch 60 and line 81 to switch 80 which decouples the coding circuit 70 and connects the output line 61 to a sense amplifier 90 via line 91.

EXAMPLE

A memory device having a structure corresponding to the energy band diagram of FIG. 2 was grown by molecular beam epitaxy on a semi-insulating LEC GaAs substrate. The channel layer 18 comprised 750 Å of n-type GaAs Si doped to $1\times10^{17}$ cm$^{-3}$, and the barrier layer 20.3 comprised 1000 Å of undoped AlAs. An undoped ($p\approx1\times10^{15}$ cm$^{-3}$) 2000 Å thick GaAs floating gate region 20.1 was grown on top of barrier 20.3 and was followed by an undoped barrier 20.4 comprising 200 Å of AlAs and an undoped injector region 20.2 comprising 1800 Å of $Al_xGa_{1-x}As$ compositionally graded from $x=1$ adjacent barrier 20.4 to $x=0$ adjacent contact layer 34. The GaAs n+ contact layer 34 was Si doped $2\times10^{18}$ cm$^{-3}$ and was 5000 Å thick.

To process the devices the gate contact was evaporated (Ge/Au/Ag/Au, 40 $\mu$m$\times$150 $\mu$m) and the gate mesa was defined with standard photolithographic techniques. The etching, performed with a (3:1:50) $H_3PO_4$:$H_2O_2$:$H_2O$ solution, was stopped a few hundred Angstroms above the graded region 20.2. The source and drain contacts were evaporated (Ni/Au/Ge/Ag/Au, 80 $\mu$m$\times$150 $\mu$m, 60 $\mu$m separation) and alloyed together with the gate contact (450° C., 18 s). The different composition of the contacts insured that, while the gate contact is shallow, the source and drain contacts deeply penetrate and reach the channel 18. To finish the processing the devices were further etched while monitoring the source-to-drain conductance until it dropped to the expected channel value. This procedure guaranteed that the surface potential depleted primarily the barrier and floating gate layers and only marginally affected the channel conductance.

The device was operated as follows. The drain was positively biased (typically at$\approx$1 V) and electrons were injected into the floating gate via a negative gate pulse. The band diagram during this write phase is shown in FIG. 3. The width of the floating gate layer was such that most of the injected electrons were collected. This negative charge partially depleted the channel causing a decrease in the drain current. The device can be subsequently erased by applying a pulse of opposite polarity to the gate or by using visible light (similar to what is done in FAMOS devices with uv light). In the latter erasure mode, the holes photogenerated throughout the structure preferentially accumulate in the floating gate layer and recombine with the electrons stored in the GaAs well, while the majority of photoexcited electrons drift away from it.

It is important to note that the electrons once injected by the graded bandgap region 20.2 into the potential well do not drift laterally towards the drain (e.g., the electrons are confined to region 22.1 under the gate as shown in FIG. 1). Such drift is prevented by the following mechanism. The surface potential of the etched region between the gate and drain electrodes depletes the portion of the floating gate layer beneath it. This depletion provides both electrostatic lateral confinement and a high lateral spreading resistance which also aids confinement of the injected electrons. The high density of the latter (typically$\gtrsim10^{11}$ cm$^{-2}$) simultaneously screens the source-to-drain field in the portion of the floating gate layer beneath the control gate metallization. Thus, practically all the source-to-drain voltage drops across the highly resistive portion of the floating gate layer between the control gate and the source and drain, which further reduces the lateral leakage of electrons. These electrons accumulate primarily at the interface with the AlAs gate-side barrier 20.4. They are confined there in a quasiequilibrium situation by the interface electric field associated with the positive charge of the ionized donors in the channel region depleted by the stored electrons. Electrons eventually leak-out of the floating gate potential well by thermionic emission across the AlAs channel-side barrier 20.3. This emission restores, after a certain time, the initial value of the drain current.

The measurements were performed in a Helitran dewar from liquid helium to room temperature. With the source at ground, electrons were injected in the well by applying negative pulses of different amplitude and duration to the gate contact, causing a drop of the drain current $I_D$. $I_D$ was measured as a function of time at constant positive drain-to-source bias $V_{DS}$. The state of the memory can be read by measuring the drain current at any given time.

The drain current as a function of time at 140° K. was measured following electron injection with a $-5$ V gate pulse of 1 ms duration at $V_{DS}=+0.8$ V. After an initial drop, the current tended to return to its original value with a time constant related to the discharging of the floating gate potential well. From the values of the drain current before and immediately after the injection pulse, the charge accumulated in the well was estimated. From such data, the doping level of the channel and the dimensions of the structure, calculations show that $\approx10^8$ electrons were stored in the well, corresponding to a sheet density of $\approx10^{12}$/cm$^2$. Following an initial short nonexponential decay, the current decayed exponentially with a time constant of 4 hrs., the storage or retention time of the memory. Similar measurements at liquid nitrogen temperatures under identical injection and bias conditions revealed no visible decay of the drain current after several hours. From a plot of the time constant vs. reciprocal temperature an activation energy of 0.2 eV was deduced. This is close to the measured value of the conduction band discontinuity between AlAs/GaAs, indicating that thermionic emission across the channel-side barrier represents the main discharge mechanism of the floating gate. Extrapolating the Arrhenius plot down to 77K, a storage time$\approx$700 yrs. was estimated. These results illustrate the potential of these devices for non-volatile memory applications in GaAs/AlGaAs-based low temperature electronics.

At room temperature, the devices exhibited storage times of a few seconds. These time constants place these devices in the realm of interest for dynamic memories as well. Measurements were made of the effect of varying the gate pulse amplitude from $-2.5$ V to $-7$ V for the same pulse duration (1 ms). An increasing drain current drop was observed and was a manifestation of the greater charge injected in the floating gate. In this gate voltage range, injection is controlled by space charge limited transport in the strongly biased graded bandgap injector region.

To erase the memory a light pulse (<1 s duration) from a microscope lamp was turned on sometime after a negative pulse was applied to the drain. After a transient the measured drain current returned to the original value.

In order to electrically erase the memories with a positive gate pulse, which would be useful for $E^2$-PROM's (Electrically Erasable Programmable Read Only Memories), leakage currents need to be reduced by reducing the thickness of the graded injector region 20.2. Such a design would allow use of considerably reduced gate voltages to erase the device by tunneling. The erase operation is also facilitated by making the injector region with both sides graded as described with reference to FIGS. 6 and 7. Without such a modification the devices are still suitable for EAROM's (Electrically Alterable Read Only Memories) at cryogenic temperatures and for DRAMS at room temperature.

It should be noted that the quasi-stationary value reached by the current after the gate pulse, was lower than that before the pulse by about 10%. This suggests that deep levels are present, particularly in the AlAs barriers. The drain current did not return to the original value for times significantly longer than the dominant time constant. To restore the original drain current the samples were briefly illuminated.

The ratio of the drain currents between the logic states of the memory is presently about 3:1 but in some applications (e.g., simple read circuits) a ratio of 10:1 would be desirable and can be obtained by reducing the channel layer doping and/or thickness. In addition, well-known electrical isolation zones, surrounding the active region of the device, may be used to reduce leakage current between source and drain. The lateral portions of such isolation are depicted by zones 33 (FIG. 1), 33' (FIG. 11) and 33'' (FIG. 12).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although holes have lower mobility than electrons, making n-type devices preferred, p-type devices are not precluded. In addition, an array of memory devices in accordance with the invention may be used as an array of photodetectors in a variety of different applications; for example, to detect optical signals transmitted by self-electro-optic effect devices (SEEDs) or to detect optical images. The latter application is illustrated in FIG. 14 where object 102 is imaged onto array 100 of charged floating gate memory devices 101 in accordance with the invention. The spatially varying light intensity of the image erases selected devices 101 creating an electrical signal detected by equipment 104. The amount of charge coupled out of each well is related to the intensity of light incident on that well, hence the device provides as a grey-scale capability.

We claim:

1. A memory circuit comprising
   a plurality of write lines, read lines, power supply lines, and row select lines,
   a plurality of memory cells connected to said lines, each of said cells comprising
      a memory device which includes
         source, drain and control gate electrode means,
         a semiconductor channel for conducting carriers from said source to said drain means, and
         a semiconductor heterostructure disposed between said channel and control gate means, said heterostructure including a floating gate potential well for confining carriers in a region sufficiently close to said channel to at least partially deplete it and further including a graded bandgap injector region for controlling the flow of carriers between said control gate means and said potential well,
      said source means being connected to a source of reference potential,
   a first FET having its channel connected between said gate means of said memory device and one of said write lines,
   a second FET having its channel connected between said drain means of said memory device and one of said read lines and one of said power supply lines,
   the gates of said FETs being connected to one of said row select lines, and
   circuit means for maintaining the voltage on said supply line essentially constant.

2. The circuit of claim 1 further including a coding circuit comprising
   an array of inverters coupling a plurality of input lines, on which a byte of information to be stored is applied, to a corresponding plurality of output lines, each of which is coupled to a separate one of said write lines,
   means for receiving clock pulses,
   means for transferring a clock pulse unaltered to a write line whenever a bit from said byte on the corresponding input line is a logic "1", and
   means for inverting said clock pulse if the corresponding bit of said byte is a logic "0", said unaltered transfer and inverting occurring whenever said memory circuit utilizes negative clock pulses, and conversely whenever said memory circuit utilizes positive clock pulses.

3. Optical detection apparatus comprising
   an array of memory devices each comprising
      source, drain and control gate electrode means,
      a semiconductor channel for conducting carriers from said source to said drain means, and
      a semiconductor heterostructure disposed between said channel and control gate means, said heterostructure including a floating gate potential well for confining carriers in a region sufficiently close to said channel to at least partially deplete it and further including a graded bandgap injector region for controlling the flow of carriers between said control gate means and said potential well
   means for injecting carriers into the wells of said devices,
   means for making light incident on said array so as to remove carriers from at least one of said devices, thereby generating an electrical signal therefrom, and
   means for detecting said signal.

* * * * *